(12) United States Patent
Wells et al.

(10) Patent No.: US 6,651,238 B1
(45) Date of Patent: Nov. 18, 2003

(54) PROVIDING FAULT COVERAGE OF INTERCONNECT IN AN FPGA

(75) Inventors: Robert W. Wells, Cupertino, CA (US); Robert D. Patrie, Scotts Valley, CA (US); Eric J. Thorne, Santa Cruz, CA (US); Michael M. Matera, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 71 days.

(21) Appl. No.: 09/837,380

(22) Filed: Apr. 17, 2001

(51) Int. Cl.[7] .............................................. G06F 17/50
(52) U.S. Cl. ................... 716/16; 716/4; 716/5; 716/17
(58) Field of Search ............... 716/4–5, 16–18; 714/725–726; 703/14–15; 326/38–40

(56) References Cited

U.S. PATENT DOCUMENTS

| | | | | |
|---|---|---|---|---|
| 5,612,891 A | * | 3/1997 | Butts et al. ................ 716/16 |
| 5,633,813 A | * | 5/1997 | Srinivasan ................. 703/14 |
| 5,869,979 A | * | 2/1999 | Bocchino ................... 326/38 |
| 5,870,410 A | * | 2/1999 | Norman et al. ............. 714/725 |
| 6,151,689 A | * | 11/2000 | Garcia et al. .............. 714/49 |
| 6,237,124 B1 | * | 5/2001 | Plants ...................... 714/763 |
| 6,256,758 B1 | * | 7/2001 | Abramovici et al. ........ 714/724 |
| 6,470,485 B1 | * | 10/2002 | Cote et al. ................. 716/16 |

OTHER PUBLICATIONS

Pending U.S. patent application Ser. No. 09/526,138, Wells et al., filed Mar. 15, 2000.
M. Abramovici et al., "Digital Systems Testing and Testable Design", pp. 457–482, IEEE Press, 1990.

* cited by examiner

Primary Examiner—Leigh M. Garbowski
Assistant Examiner—Paul Dinh
(74) Attorney, Agent, or Firm—Bever Hoffman & Harms; Edel M. Young

(57) ABSTRACT

Fault coverage for the programmable interconnect of a programmable logic device (PLD) is provided. A user's design is modeled, thereby determining the programmable interconnect path in the device. The user's logic design is then modified, thereby facilitating the detection of faults. Specifically, any function generators in the PLD are implemented as predetermined logic gates, thereby forming a logic gate tree design. The synchronous elements in the user's design are preserved and transformed, if necessary, to provide controllability. Then, a vector can be exercised in the new design. A first readback of the PLD can be compared to a second readback of a fault-free model of the design.

20 Claims, 12 Drawing Sheets

PROVIDING FAULT COVERAGE OF INTERCONNECT IN AN FPGA

FIELD OF THE INVENTION

The present invention relates to fault coverage and specifically to fault coverage of interconnect in an FPGA.

DESCRIPTION OF THE RELATED ART

Fault simulation is a well-known method of determining the quality of the test vectors used to verify the functionality of an application specific integrated circuit (ASIC). FIG. 1 illustrates a simplified flow diagram of fault simulation. In fault simulation, the operation of a gate-level model 103 of the ASIC is tested by a simulation program 102 using multiple sets of input signals 101, which include both stimuli (data) and control signals. Each set of input signals 101 is called a vector. Simulation program 102 generates the result 104, i.e. the output signals of model 103, for each vector.

Generally, model 103 is first tested for its fault-free response, i.e. the "good" response, then for induced fault responses. To induce a fault response, each node leading to logic in model 103 is individually held at a logic one. In this manner, irrespective of other input signals to the logic, that particular node can only carry a logic one. If a set of vectors can detect a change somewhere (i.e. that the signature no longer compares to the good response), then that stuck-at-one fault is detectable. Similarly, each node is individually held at a logic zero. If the set of vectors can detect each change, then each stuck-at-zero fault is detectable. In one embodiment including a library 105 of stuck-at-zero and stuck-at-one faults, each fault is inserted into model 103 one at a time.

In the above example, fault coverage would indicate what percentage of the universe of stuck-at-one faults and stuck-at-zero faults could be detected by the given set of vectors. In other words, fault coverage indicates the efficacy of the vectors in detecting each fault in a universe of potential faults. Thus, if stimuli and control 101 is able to detect every fault enumerated in fault library 105, then fault coverage approaching 100% has been achieved.

Fault simulation has been shown to correlate well with physical faults in the ASIC. Therefore, after simulation is complete, the ASIC is then tested with the same vectors used in the simulation. The response generated by the ASIC when exercised by these vectors is compared with the results generated from the fault free simulation. Any difference between the two indicates that a defect has been detected in the ASIC.

Clearly, as logic designs increase in complexity, merely creating the set of vectors can be extremely time consuming. Moreover, even assuming unlimited financial and personnel resources, fault coverage for a complex ASIC never reaches 100%. Thus, depending on the application of the ASIC, fault coverage in the range of 80% to 99% is typically considered acceptable.

To facilitate better fault simulation when an ASIC is being designed, test structures for DFT (design-for-test) could be added to the chip to provide the desired controllability and observability. Clearly, controlling a node to detect a stuck-at-one or stuck-at-zero fault is ineffective if one cannot observe its effect. Similarly, if one has an observation point, but cannot switch a value at a node, then fault simulation is impossible. Thus, controllability and observability typically are addressed at the same time.

In one embodiment, a test structure could include a plurality of flip-flops connected as a linear feedback shift register (LFSR). A LFSR can be used to generate data for exhaustive testing, psuedorandom testing, or pseudoexhaustive testing. A detailed description of these tests is provided in "Digital Systems Testing and Testable Design", pages 457–482, by M. Abramovici et al., IEEE Press, 1990. In other embodiments, test structures such as pseudo random data generators or signature analyzers are used for DFT.

However, the increased controllability/observability of DFT comes at a significant cost. Specifically, the flip-flops of the test structure have considerably more transistors than flip-flops included in the functional logic. Thus, valuable real estate is used for test, which could otherwise be used for additional functional logic. Moreover, typical test structures also include multiplexers for selectively accepting data from a scan-in port or from the data. Therefore, during on-line DFT, these multiplexers can undesirably slow down normal functional operation.

Fault simulation and DFT are applicable to other types of integrated circuits, such as programmable logic devices. One popular type of programmable logic device is the field programmable gate array (FPGA). In fact, as technology improvements are realized, FPGAs are increasingly moving into previously ASIC-only applications. Unfortunately, physical resources are even more constrained on an FPGA than on an ASIC. Thus, generally the use of dedicated test structures on an FPGA is minimized. Additionally, in light of the programmable nature of an FPGA, providing the And user with the means to verify exhaustive fault coverage, i.e. for all possible configurations of the FPGA, is commercially impractical. Irrespective of these issues, users are requesting ASIC-type information for FPGAs, such as stuck-at-one fault coverage and stuck-at-zero fault coverage. Therefore, a need arises for providing fault coverage of an FPGA containing a specific user design.

SUMMARY OF THE INVENTION

The present invention provides fault coverage for the programmable interconnect of a programmable logic device (PLD). In the present invention, a user's design is modeled, thereby determining the programmable interconnect path in the device. The present invention allows the programmable interconnect path to be preserved while ensuring the necessary control and observation of the fault tests.

Specifically, two derivative designs are generated based on the user's design. In a first derivative design, the lookup tables (LUTs) in the function generators of the user's design are configured to a first type of logic gate to detect stuck-at-one faults. In a second derivative design, the LUTs are configured to a second type of logic gate to detect stuck-at-zero faults. Thus, in either derivative design, a logic gate tree is formed. In one embodiment, all LUTs are implemented as either AND or OR gates.

Advantageously, in the two derivative designs, the synchronous elements of the user's design are substantially preserved. In general, synchronous elements can be transformed, if necessary, to provide greater control during the fault tests. For example, flip-flops without initialization or reverse features can be transformed to provide these features. The input and output elements of the user's design can also be transformed, if necessary. For example, a non-registered input or output element can be transformed into a registered input or output element, such as a flip-flop, to provide the desired controllability and observability. An output element providing signals to external devices can be further transformed to include tristating on its output, thereby allowing the tests to be run within a functioning system.

The method of the present invention includes the basic steps of determining the programmable interconnect path in the user's design, configuring the function generators in the user's design for a stuck-at-one or stuck-at-zero test, controlling the synchronous elements in the user's design, providing a test vector, providing test clocks, and observing certain nodes in the design. In one embodiment, these nodes correspond to values stored by the synchronous elements. As noted above, certain features of the synchronous elements can be advantageously used to control the synchronous elements. For example, in one programmable logic device, each synchronous element (such as a flip-flop) can include an initialization terminal (INIT) that can force the flip-flop into a predetermined state (i.e. the value stored on the Q output terminal of the flip-flop) and a reverse terminal. (REV) that can force the flip-flop into a state opposite that of the predetermined state.

In the case of the stuck-at-zeros test, the LUTs in the user design can be reconfigured as AND gates and the flip-flops in the design can be initialized to logic ones. At this point, REV can be asserted and released, thereby forcing the values provided on the Q output terminals of the flip-flops to logic zeros. The contents of all flip-flops can be verified by executing a first readback sequence.

Errors in the readback data can be detected by a bit by bit comparison with the expected bit sequence, or by accumulating a signature on the readback data and then comparing the signature with the expected signature. An incorrect readback data stream implies that the REV terminal on one or more flip-flops is stuck "inactive". If the readback data stream is correct, then the test continues. Specifically, INIT can be asserted and then released, thereby forcing the values provided on the Q output terminals of the flip-flops to logic ones.

A clock pulse can then be applied to the clock input terminal of all the flip-flops. This pulse transfers the values provided on the D input terminals of the flip-flops into the flip-flops, and thus onto their Q output terminals. The values on the Q output terminals can then be verified by executing a second readback sequence. Because all LUTs have been converted to AND gates, all flip-flop outputs were set to logic ones, and a test vector of all logic ones has been applied to the logic nets, expected readback values for the flip-flops after the clock would be all logic ones.

At this point, the actual readback data can be compared to the expected readback data. An error in the actual readback values implies that one or more interconnect in the AND gate tree, or from the tree to the flip-flops are stuck at logic zero. A faulty readback could also imply that the REV terminal on one or more flip-flops is stuck "active", or that the INIT terminal of one or more flip-flops is stuck "inactive". If the readback data is correct, then no stuck-at-zero faults are detected in the programmable logic device implementing the user's design.

A similar process is followed for the stuck-at-one test. Specifically, the LUTs in the user design can be reconfigured as OR gates and the flip-flops can be initialized to logic zeros. At this point, REV can be asserted and released, thereby forcing the values provided on the Q output terminals of the flip-flops to logic ones. The contents of the flip-flops, i.e. the values provided on the Q output terminals, are verified by executing a first readback sequence.

Once again, errors in the readback data can be detected by a bit by bit comparison with the expected bit sequence, or by accumulating a signature on the readback data and then comparing the signature with the expected signature. An incorrect readback data stream implies that the REV terminal on one or more flip-flops is stuck "inactive", or that the INIT terminal of one or more flip-flops is stuck "active". INIT can then be asserted and released, thereby forcing the values provided on the Q output terminals of the flip-flops to logic zeros.

A clock pulse can then be applied to the clock input terminal of all the flip-flops. This pulse transfers the values on the D input terminals into the flip-flops, and thus onto their Q output terminals. The states of these flip-flops are then verified by executing a second readback sequence. Because all LUTs have been converted to OR gates, all flip-flop outputs were set to logic zeros, and a test vector of all logic zeros has been applied to the primary inputs, expected readback values for the flip-flops after the clock would be all logic zeros.

The actual readback data can be compared to the expected readback data. An error in the readback values implies that one or more interconnect in the OR gate tree, or from the tree to the flip-flops is stuck at logic one. If the readback data is correct, then no stuck-at-one faults are detected in the programmable logic device implementing the user's design.

In accordance with one feature of the present invention, the block random access memory (BRAM) of the user's design can also be controlled and observed during the fault testing. In the stuck-at-one test, the BRAM is initialized during configuration to all ones. The first test clock causes the initialization values on the input terminals of the BRAM to appear on the output terminals. Thus, all ones should appear on the BRAM output terminals. Also during the first test clock, a zero is written to address 0. The second test clock causes the zero on the input terminal at address 0 to appear on the BRAM output terminal, while a zero is re-written into address 0. Capture/readback can verify that a zero was propagated from that BRAM output terminal to a downstream flip-flop. Readback of the BRAM verifies that a zero was written into address zero and into no other cell. Control pins, such as write enable (WE) and enable (ENA), are programmed to be active low for the stuck-at-one test.

In the stuck-at-zero test, the BRAM is initialized during configuration to all zeros. The first test clock causes the initialization values on the input terminals of the BRAM to appear on the output terminals. Thus, all zeros should appear on the BRAM output terminals. Also during the first test clock, a one is written to the address designated by all ones (referenced herein as address XXX). The second test clock causes the data at location XXX to appear on the BRAM output terminals, while a one is re-written into address XXX. Capture/readback can verify that a one was propagated from that BRAM output terminal to a downstream flip-flop. Readback of the BRAM verifies that a one was written into address XXX and into no other cell(s). Control pins, such as write enable (WE) and enable (ENA), are programmed to be active high for the stuck-at-zero test.

Identifying stuck-at-one or stuck-at-zero faults can be performed during a readback operation. In one embodiment, a fault-free signature is derived from simulation. The signature produced during readback is compared to the fault-free signature. Any difference between these signatures indicates that one or more faults have been detected. Various known signatures can be used including, but not limited to, CRC and other types of compression/capture/analysis. In another embodiment, every bit in the readback data can be verified.

DETAILED DESCRIPTION OF THE DRAWINGS

Field programmable gate arrays (FPGAs) pose unique challenges in providing fault coverage. FPGAs typically include an array of configurable logic blocks (CLBs), a plurality of input/output blocks (IOBs) on the periphery for facilitating communication with external devices, and a programmable interconnect for connecting the CLBs and the IOBs. Customers configure the FPGA by using software that generates a bitstream. The bitstream, loaded into the FPGA, configures the CLBs, the IOBs, and the interconnect to provide the user-desired functionality.

Testing of some of the resources of an FPGA can be performed using a design-independent method developed by the assignee of the present invention. In a design-independent method, the vectors will detect stuck-at-one faults and stuck-at-zero faults for certain features even without knowing a user's logic design. Specifically, U.S. patent application Ser. No. 09/526,138, entitled "Methods and Circuits For Testing Programmable Logic", filed on Mar. 15, 2000, and incorporated by reference herein, describes in detail providing fault coverage for certain features of an FPGA, including but not limited to flip-flops, look-up tables (LUTs), and multiplexers.

However, testing of the programmable interconnect can be even more difficult than testing of the specific features included in the CLBs and IOBs. Top of the line FPGAs have extensive routing, which allows for signal propagation to and from any location on the chip. Therefore, providing fault coverage for all possible routing configurations of these FPGAs, by an end user, is impractical.

In accordance with the present invention, providing fault coverage for the programmable interconnect of an FPGA is accomplished by focusing on a specific user's logic design. In this manner, the universe of possible routing configurations is narrowed to the actual routing configuration of interest to the user. Moreover, to further simplify the process, the elements inside the CLBs (and IOBs) are dealt with in a special manner detailed below.

Figure 1:
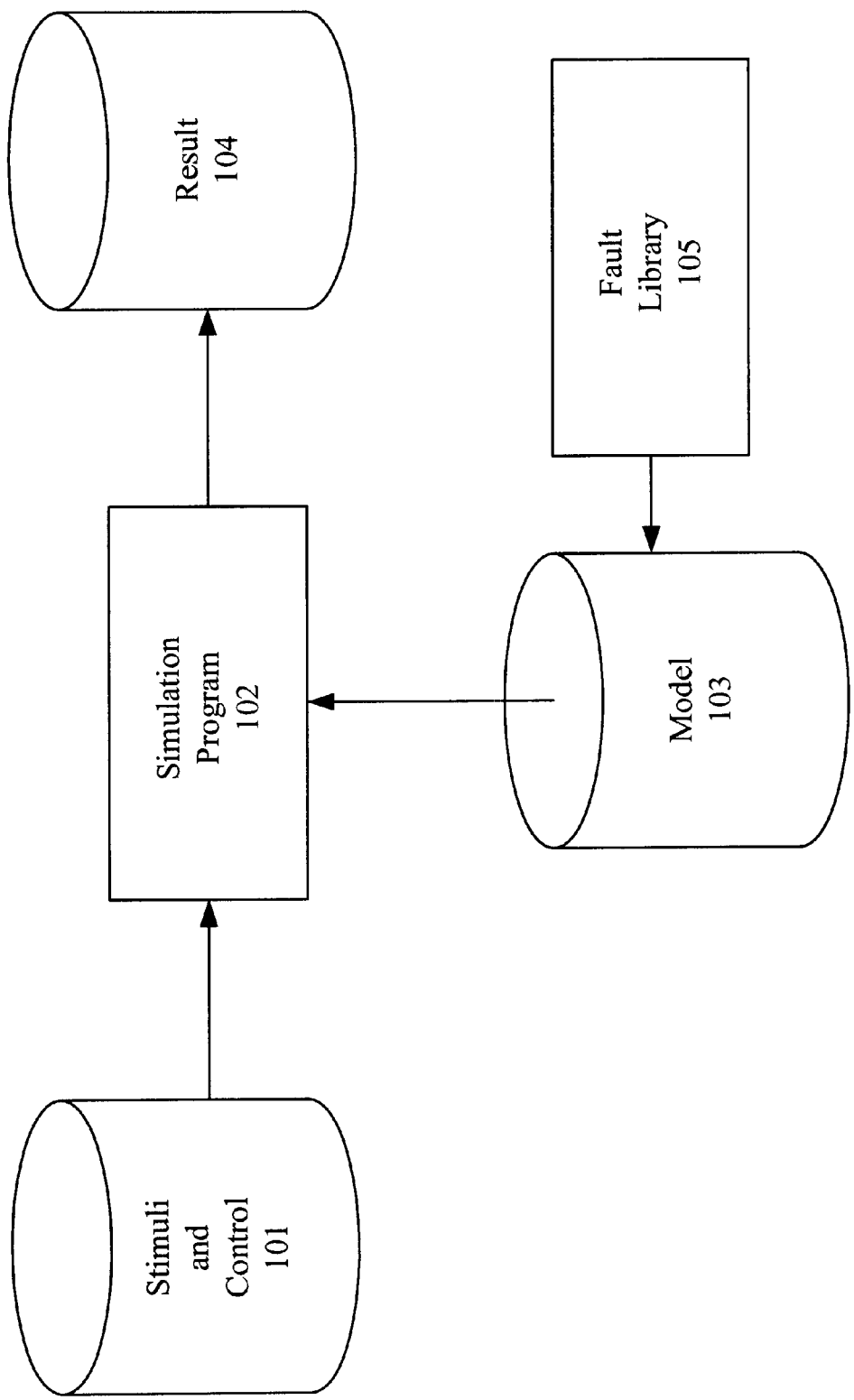
FIG. 1 illustrates a simplified flow diagram of fault simulation.
Figure 2:
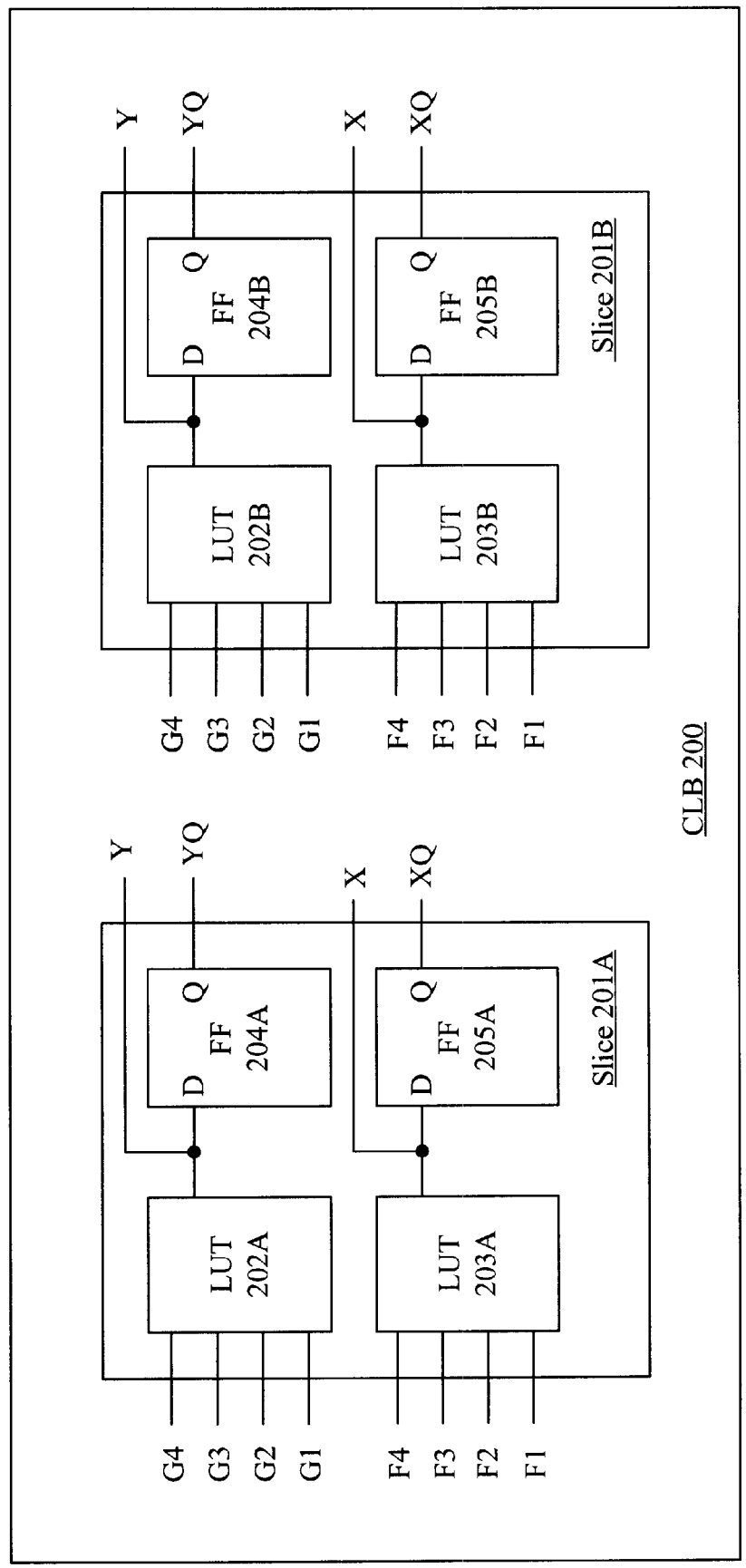
FIG. 2 illustrates a simplified schematic of a configurable logic block (CLB) in an example FPGA.

FIG. 2 illustrates a simplified schematic of a CLB 200 in the Virtex™ FPGA sold by Xilinx, Inc. CLB 200 includes two "slices" 201A and 201B. Each slice 201 includes a first LUT 202 for receiving a first plurality of input signals G1–G4 from the programmable interconnect and a second LUT 203 for receiving a second plurality of input signals F1–F4, also from the programmable interconnect. Each slice 201 further includes a flip-flop 204 for receiving (on its D terminal) an output signal Y from LUT 202 and outputting (on its Q terminal) a signal YQ. In a similar manner, each slice 201 further includes a flip-flop 205 for receiving (on its D terminal) an output signal X from LUT 203 and outputting (on its Q terminal) a signal XQ.

Figure 3:
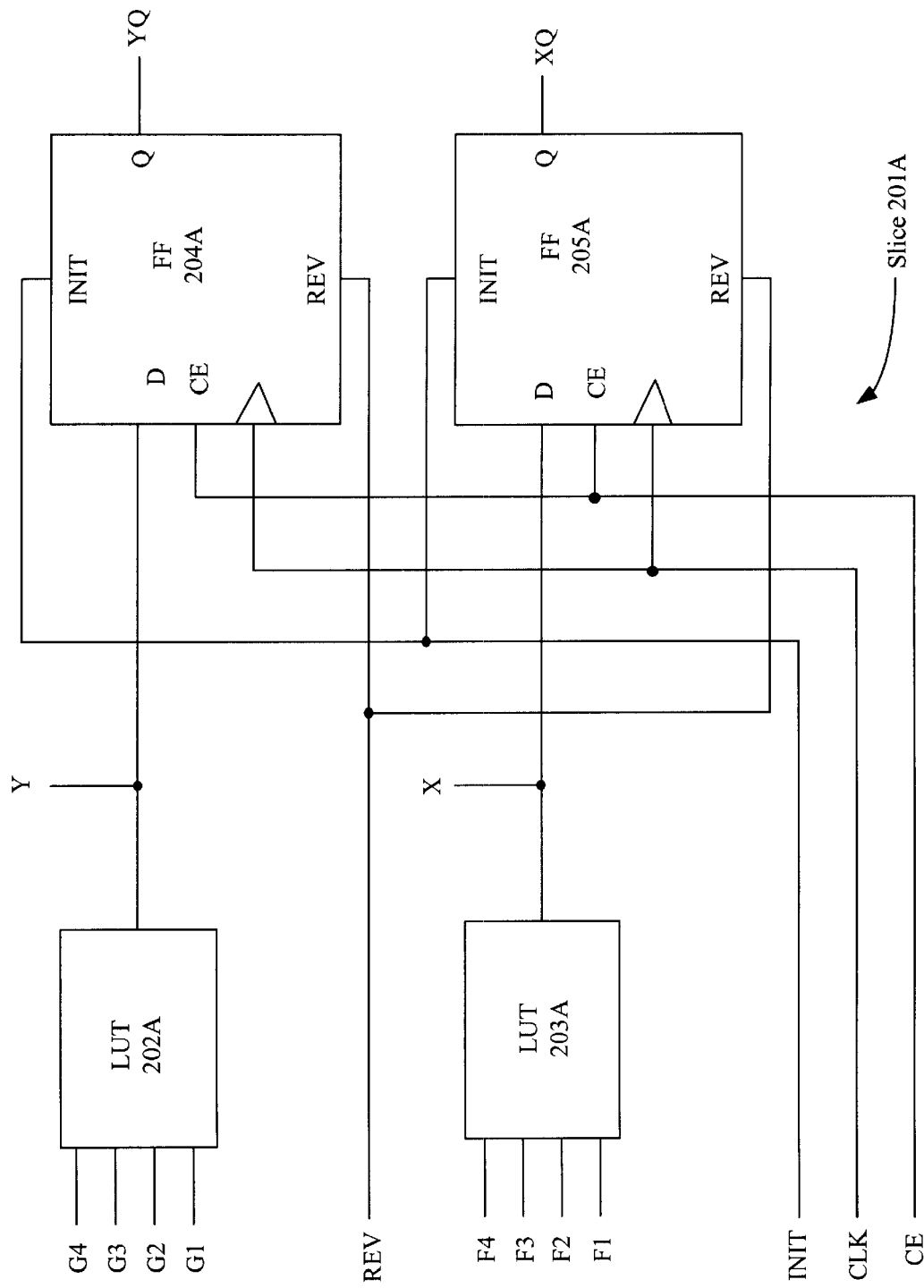
FIG. 3 illustrates a more detailed schematic of a slice in the CLB of FIG. 2.

FIG. 3 illustrates a more detailed schematic of slice 201A in CLB 200 (FIG. 2). As shown in FIG. 3, flip-flops 204A and 205A receive identical clock enable (CE) signals, clock (CLK) signals, initialization (INIT) signals (thereby forcing the flip-flop into a predetermined state), and reverse (REV) signals (thereby forcing the flip-flop into the opposite state specified for it in the predetermined state). Note that control signals CE, CLK, INIT, and REV are typically provided by the programmable interconnect.

In an ASIC, testing of the logic is inseparable from testing of the interconnect. In other words, test signals are placed at the input pins and output pins are monitored. Thus, a circuit must be set up in a certain state to observe a particular node, then set up in yet another state to observe another node. In some cases, branching in the logic design can mask a fault at a particular node.

The present invention eliminates this time-consuming and error-prone ASIC task by taking advantage of a fundamental difference between ASICs and FPGAs, i.e. the re-programmability of the FPGA. Using this unique feature, the FPGA can propagate any stuck-at-one or stuck-at-zero fault to an observable node (described in detail below). In this manner, unlike an ASIC, the present invention can advantageously provide fault coverage approaching 100% for the programmable interconnect.

Detecting Stuck-at-zeros

Specifically, in accordance with one aspect of the present invention, the content of each LUT in the CLBs is replaced with an AND function of its input signals. Thus, for example, a LUT having 4 inputs will be converted to an AND gate having 4 input terminals. As known by those skilled in the art, a LUT implements logic as a $2^n \times 1$ memory composed of configuration memory cells, wherein the memory is addressed by the n inputs. In the case of a 16-bit LUT that implements a four-input AND gate, all configuration bits in the LUT are zero, except for the high-order bit. To implement functions with fewer inputs, the unused inputs are held low. (Note that if any programmable inversions on data pins exist any where on the user's logic design, these inversions are eliminated.)

Figure 4:
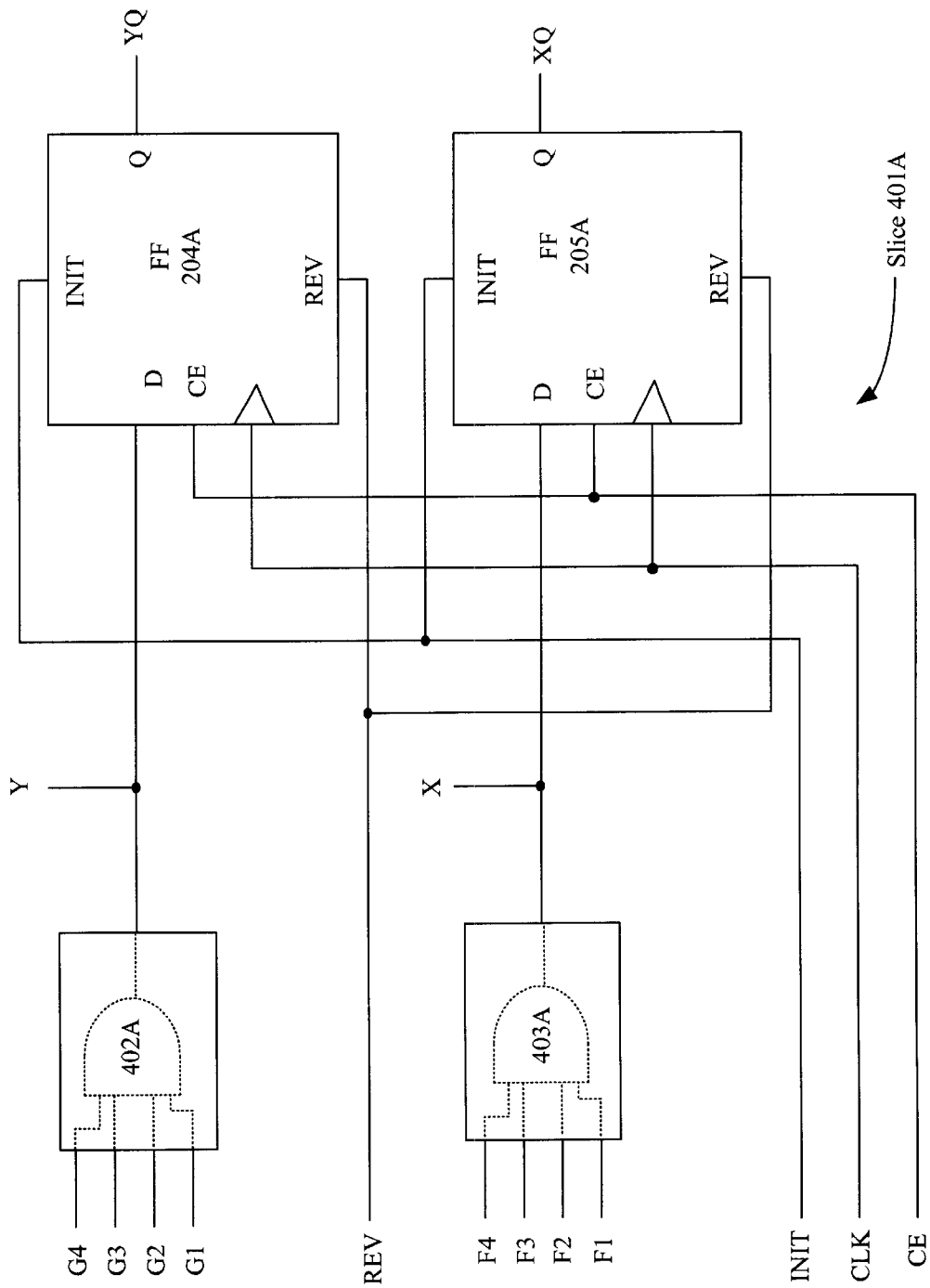
FIG. 4 illustrates the function generators of a CLB implementing AND gates in accordance with the present invention.

FIG. 4 illustrates a slice 401A of a CLB converted in accordance with the present invention. In the converted design, an AND gate 402A (i.e. LUT 202A configured as an AND gate) receives input signals G1–G4 and outputs a signal Y that is provided to the D input terminal of flip-flop 204A. In a similar manner, an AND gate 403A (i.e. LUT 203A configured as an AND gate) receives input signals F1–F4 and outputs a signal X that is provided to the D input terminal of flip-flop 205A.

The other slices throughout the FPGA have the same configuration, thereby creating a logic tree of AND gates and synchronous elements. As described above, the programmable interconnect connecting the AND gates and the synchronous elements follows the same paths provided in the user's logic design.

According to fundamental digital design, if only logic one signals are provided as primary inputs to a tree of AND gates and the values provided on the Q output terminals of fault-free flip-flops are logic ones, then after clocking the flip-flops only logic one signals should be propagated in the design. Therefore, if a logic zero is detected in the design, then a stuck-at-zero fault exists in the interconnect.

Detecting Stuck-at-ones

Under normal operating conditions, any line in the programmable interconnect must be able to switch between both logic one and logic zero signals. Therefore, in accordance with another aspect of the present invention, the content of each LUT in the CLBs is replaced with an OR function of its input signals. In the case of a 16-bit LUT that implements a four-input OR gate, all configuration bits in the LUT are one, except for the low-order bit. Once again, if any programmable inversions on data pins exist any where on the user's logic design, these inversions are eliminated.

Figure 5:
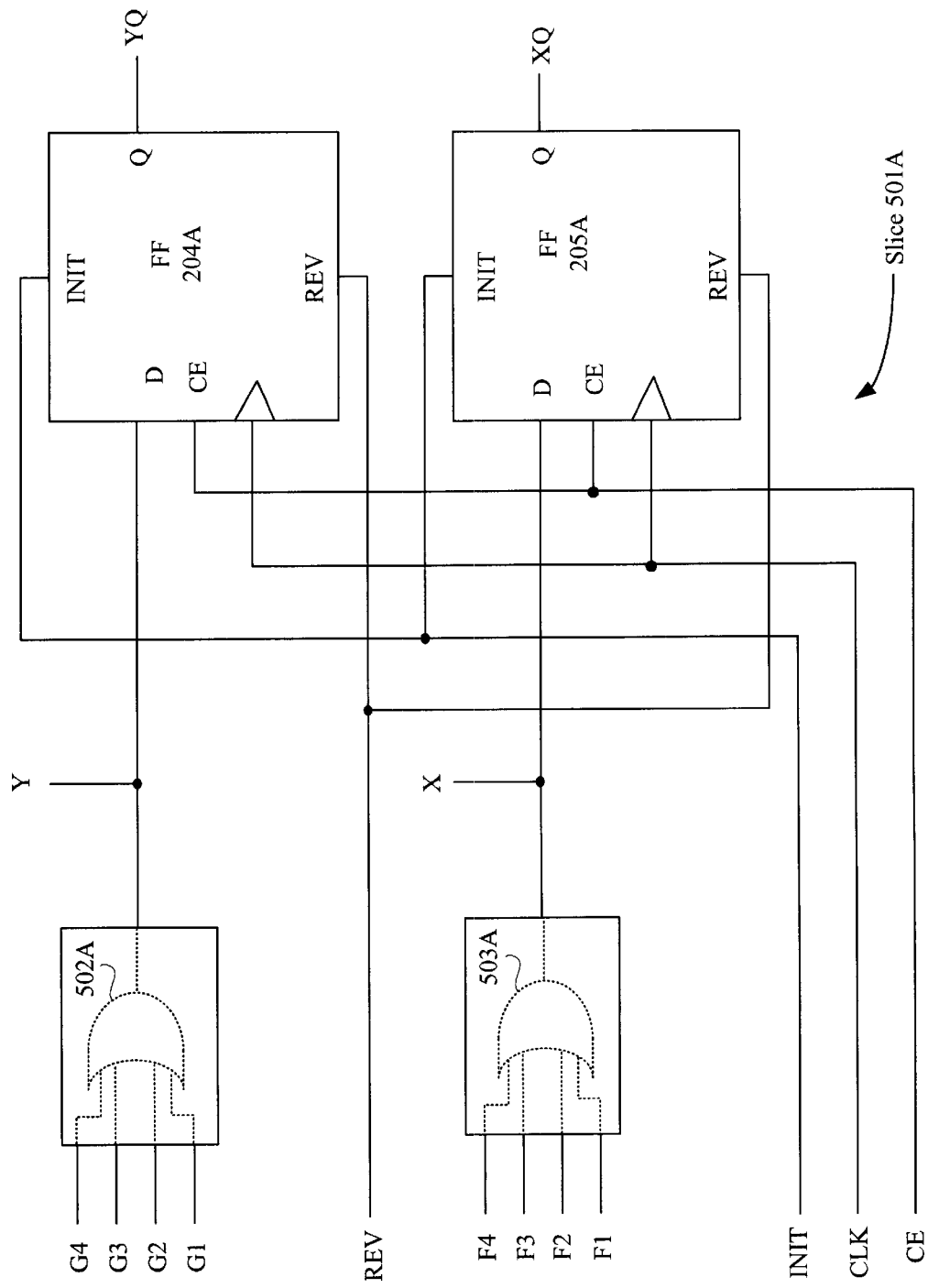
FIG. 5 illustrates the function generators of a CLB implementing OR gates in accordance with the present invention

FIG. 5 illustrates a slice 501A of a CLB converted in accordance with one embodiment of the stuck-at-ones test of the present invention. In this embodiment, an OR gate 502A (i.e. LUT 202A configured as an OR gate) receives input signals G1–G4 and outputs a signal Y that is provided to the D input terminal of flip-flop 204A. In a similar manner, an OR gate 503A (i.e. LUT 203A configured as an OR gate) receives input signals F1–F4 and outputs a signal X that is provided to the D input terminal of flip-flops 205A.

The other slices throughout the FPGA are configured in a similar manner, thereby creating a logic tree of OR gates and synchronous elements. As described above, the programmable interconnect connecting the OR gates and the synchronous elements follows the same paths provided in the user's logic design.

According to fundamental digital design, if only logic zero signals are provided as primary inputs to a tree of OR gates and the values provided on the Q output terminals of the flip-flops are logic zeros, then after clocking the flip-flops only logic zero signals should be propagated in the design. Therefore, if a logic one signal is detected in the design, then a stuck-at-one fault exists in the interconnect.

Control of Synchronous Elements

In accordance with the present invention, the flip-flops in the user's design are kept as synchronous elements. However, as indicated above, the values provided on the Q output terminals are set for each logic tree. Therefore, in a process described in detail below, the flip-flops of the user's design are controlled to provide the appropriate values for each logic tree.

Referring back to FIG. 3, in the Virter FPGA, the INIT and REV signals can be configured to operate synchronously or asynchronously. Assuming that the INIT and REV signals are configured to operate asynchronously (i.e. force the flip-flops into the same known state independent of the D and CLK inputs) and are active HIGH, Table 1 below indicates the output signals YQ and XQ from flip-flops 204A and 205A, respectively, wherein the INIT state is "0", and the active state of both INIT and REV pins is "1".

TABLE 1

| INIT (initialize) | REV (reverse) | YQ (FF204A) | XQ (FF205A) |
|---|---|---|---|
| 0 | 0 | No Change | No Change |
| 1 | 0 | 0 | 0 |
| 0 | 1 | 1 | 1 |
| 1 | 1 | 0 | 0 |

As shown in Table 1, not asserting active INIT and REV signals does not change the output of flip-flops 204A and 205A. If one of INIT and REV signals is asserted, then that asserted signal controls the output.

Although INIT and REV are typically not asserted simultaneously, these signals are independently generated, and therefore simultaneous assertion may occur. The Virtex FPGA eliminates the possibility of a metastable condition by forcing the output of flip-flops 204A and 205A to "0" if both INIT and REV signals are asserted. Specifically, in one embodiment, if both INIT and REV signals are asserted, then the signal which would set the flip-flops' outputs to "0"controls.

Of importance, the present invention is equally applicable to designs in which the INIT and REV signals are configured to operate synchronously. However, for each assertion of either the INIT or REV signal, an additional clock pulse is needed to change the state of the Q output terminal. This process is well known to those skilled in the art, and therefore is not explained in detail herein.

Note that a user's design may include flip-flops not instantiated with REV or even INIT terminals. In this case, in one embodiment, a pre-test modification can be performed to transform the flip-flops in the user's design to flip-flops with INIT and REV terminals. Thus, the present invention is equally applicable to any synchronous elements that can provide control and observability as described below in detail. Other PLDs can have different means to control and observe their synchronous elements. For example, in another FPGA, a single terminal can provide any desired signal on the Q output terminal of the flip-flops. In other words, any value can be provided on the Q output terminal of a flip-flop at any time. Thus, the use of the INIT and REV terminals, as described herein, is merely an elegant solution to control and observe the synchronous elements in the high performance, proprietary architecture of the Virtex FPGA.

Figure 6:
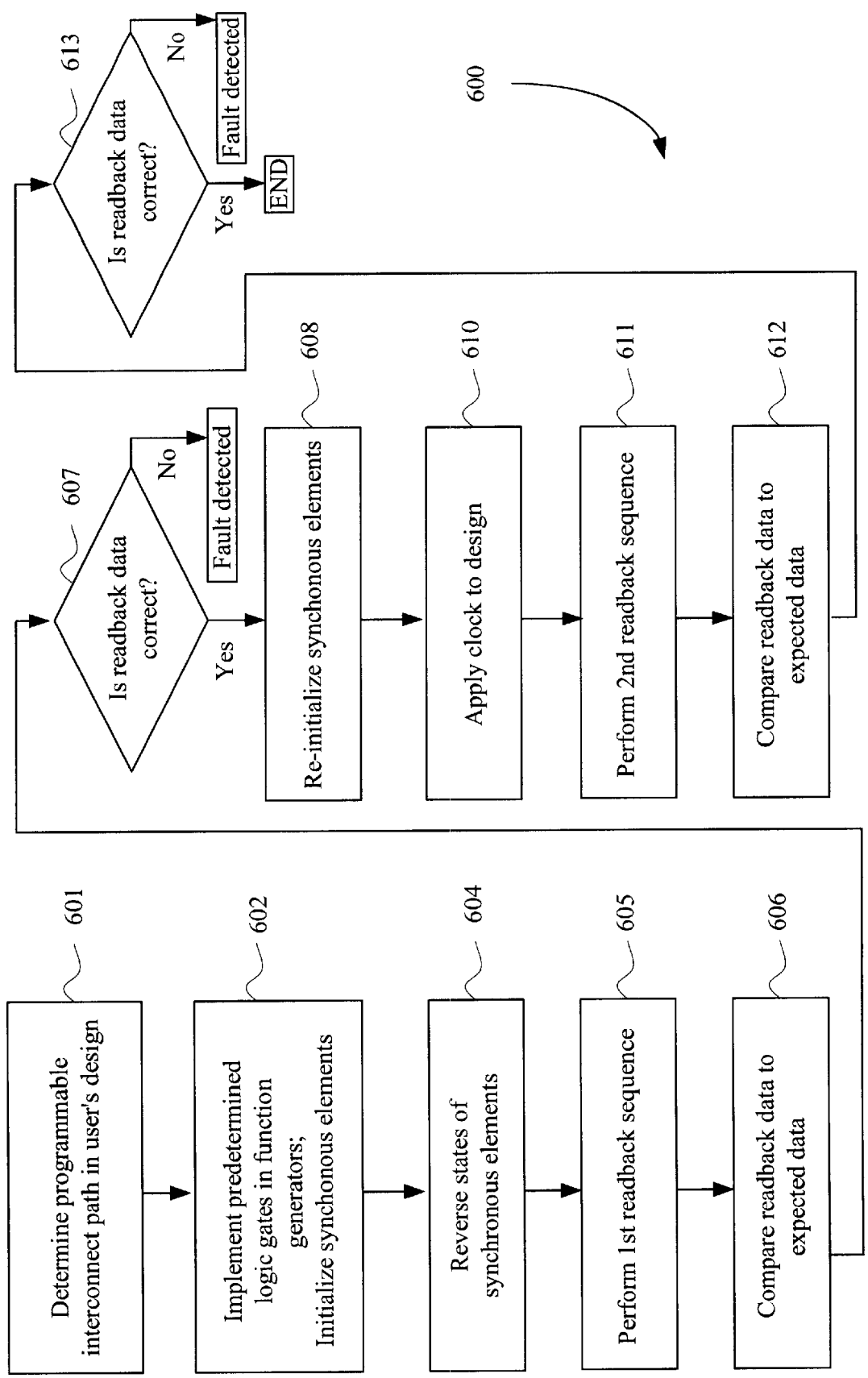
FIG. 6 illustrates a flow chart of one embodiment of the present invention implemented in a programmable logic device.

FIG. 6 illustrates a flow chart of a process 600 for controlling the flip-flops of the user's design. In either logic gate tree, the programmable interconnect path in the user's design in determined in step 601. Then, in step 602, as described above in detail, predetermined logic gates (all AND gates or all OR gates) are implemented in the function generators and, in the case of the AND gate tree, the flip-flops are initialized to "1"s (INIT=1). At this point, REV is asserted and released, thereby forcing the values provided on the Q output terminals of the flip-flops to "0"s in step 604. The contents of all flip-flops can be verified by executing a first readback sequence in step 605.

Errors in the readback data can be detected by a bit by bit comparison with the expected bit sequence, or by accumulating a signature on the readback data and then comparing the signature with the expected signature (explained in detail below) in step 606. An incorrect readback data stream, as determined in step 607, implies that the REV terminal on one or more flip-flops is stuck "inactive". If the readback data stream is correct, then the process continues.

Specifically, in step 608, INIT is asserted and then released, thereby forcing the values provided on the Q output terminals of the flip-flops back to "1"s. of importance, any flip-flops receiving a constant signal in the user's design are transformed to instead provide the INIT value, i.e. logic "1"s. A minimum of two clock pulses are then applied to the clock input terminal (CLK) of all the flip-flops in step 610. These pulses transfer the values provided on the D input terminals of the flip-flops into the flip-flops, and thus onto their Q output terminals. The values on the Q output terminals are then verified by executing a second readback sequence in step 611.

Because all LUTs have been converted to AND gates and all flip-flop outputs were set to "1" expected readback values for the flip-flops after the clock would be all "1"s. In step 612, the actual readback data can be compared to the expected readback data. An error in the actual readback values, as determined in step 613, implies that one or more interconnect in the AND gate tree, or from the AND gate tree to the flip-flops is stuck at "0". A faulty readback could also imply that the REV terminal on one or more flip-flops is stuck "active", or that the INIT terminal of one or more flip-flops is stuck "inactive". If the readback data is correct, then no stuck-at-zero faults are detected in the FPGA implementing the user's design.

Process 600 can also be used for the stuck-at-one test. In this test, the LUTs are converted to OR gates and the flip-flops are initialized to "0"s in step 602 (INIT=0). At this point, REV can be asserted and released, thereby forcing the values provided on the Q output terminals of the flip-flops to "1"s in step 604. The contents of the flip-flops, i.e. the values provided on the Q output terminals, are verified by executing a readback sequence in step 605.

Once again, errors in the readback data can be detected by a bit by bit comparison with the expected bit sequence, or by accumulating a signature on the readback data and then comparing the signature with the expected signature in step 606. An incorrect readback data stream, as determined in step 607, implies that the REV terminal on one or more flip-flops is stuck "inactive", or that the INIT terminal of one or more flip-flops is stuck "active". In step 608, INIT is asserted and then released, thereby forcing the values provided on the Q output terminals of the flip-flops to "0"s.

Of importance, any flip-flops receiving a constant signal in the user's design are transformed to instead provide the INIT value, i.e. logic "0"s. A minimum of two clock pulses are then applied to the clock input terminals (CLK) of all the flip-flops in step 610. These pulses transfer the values/on the D input terminals into the flip-flops, and thus onto their Q output terminals. The states of these flip-flops are then verified by executing the second readback sequence in step 611.

Because all LUTs have been converted to OR gates and all flip-flop outputs were set to "0", expected readback values for the flip-flops after the clock would be all "0"s. In step 612, the actual readback data can be compared to the expected readback data. An error in the readback values implies that one or more interconnect in the OR gate tree, or from the OR gate tree to the flip-flops is stuck at "1". If the readback data is correct, then no stuck-at-one faults are detected in the FPGA implementing the user's design.

Figure 7:
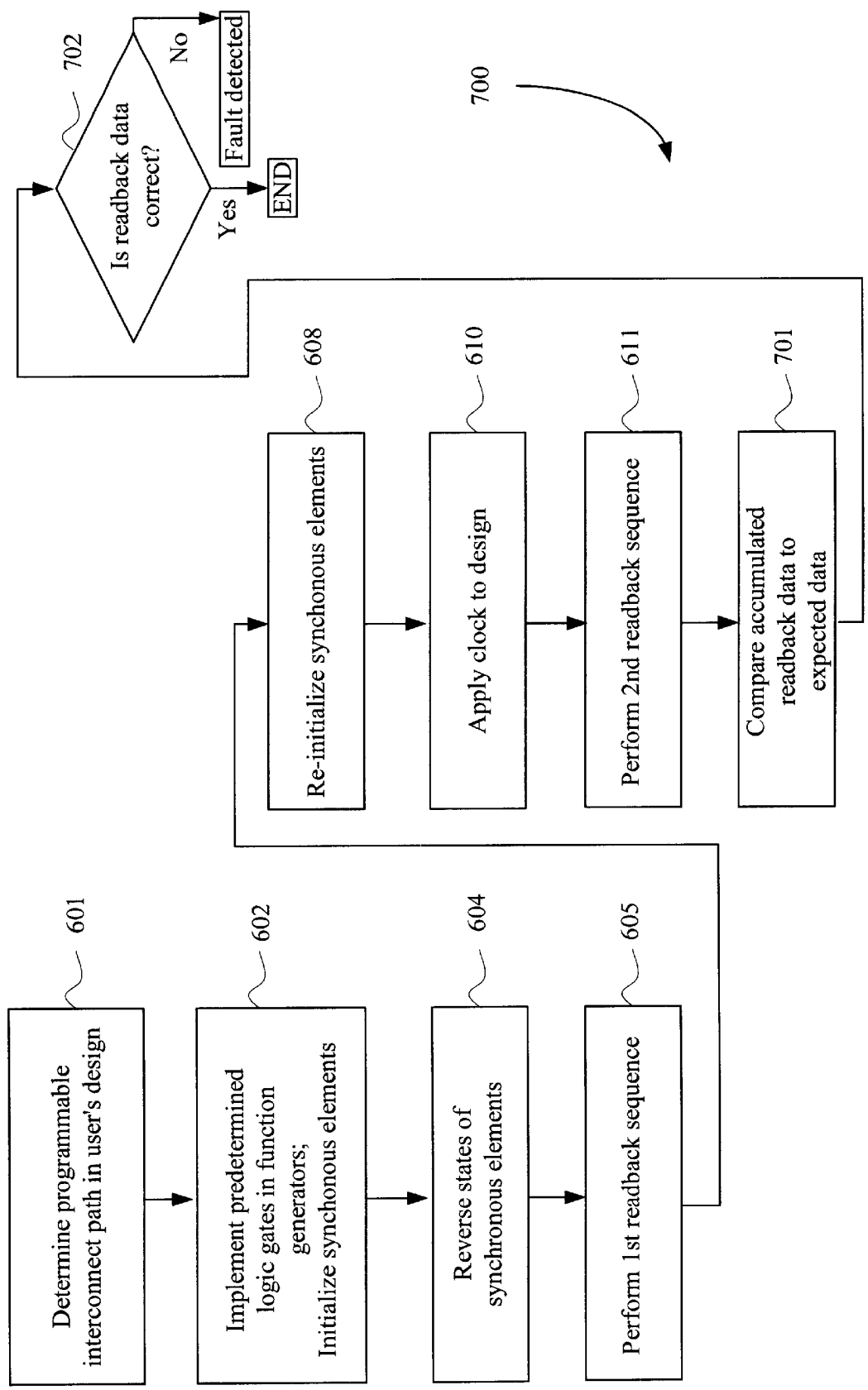
FIG. 7 illustrates a flow chart of another embodiment for controlling the flip-flops of the user's design.

FIG. 7 illustrates another embodiment of a process 700 for controlling the flip-flops of the user's design. In this embodiment, the multiple readback comparison steps provided in FIG. 6 are modified to provide an accumulation of the readback data, wherein a single comparison step can then be performed. Specifically, step 701, which occurs after the readback sequences, compares the accumulated readback data to expected data and step 702 determines if that accumulated readback data is correct (note that similar reference numerals in FIGS. 6 and 7 refer to similar steps).

Readback Operation

Readback is the process of capturing and reading the configuration and the state data of a PLD. For purposes of illustration, a readback operation in the Virtex FPGA is described in further detail. However, the present invention is equally applicable to any type of readback operation in the Virtex FPGA as well as in any other PLD.

The Virtex FPGA allows three types of readback: a readback of the configuration bitstream, a readback of the configuration bitstream as well as the state of all flip-flops and input pins, and a readback of the block RAM. Irrespective of type, the readback can be performed serially through a JTAG port or on an 8-bit wide select map port of the Virtex FPGA.

Figure 8:
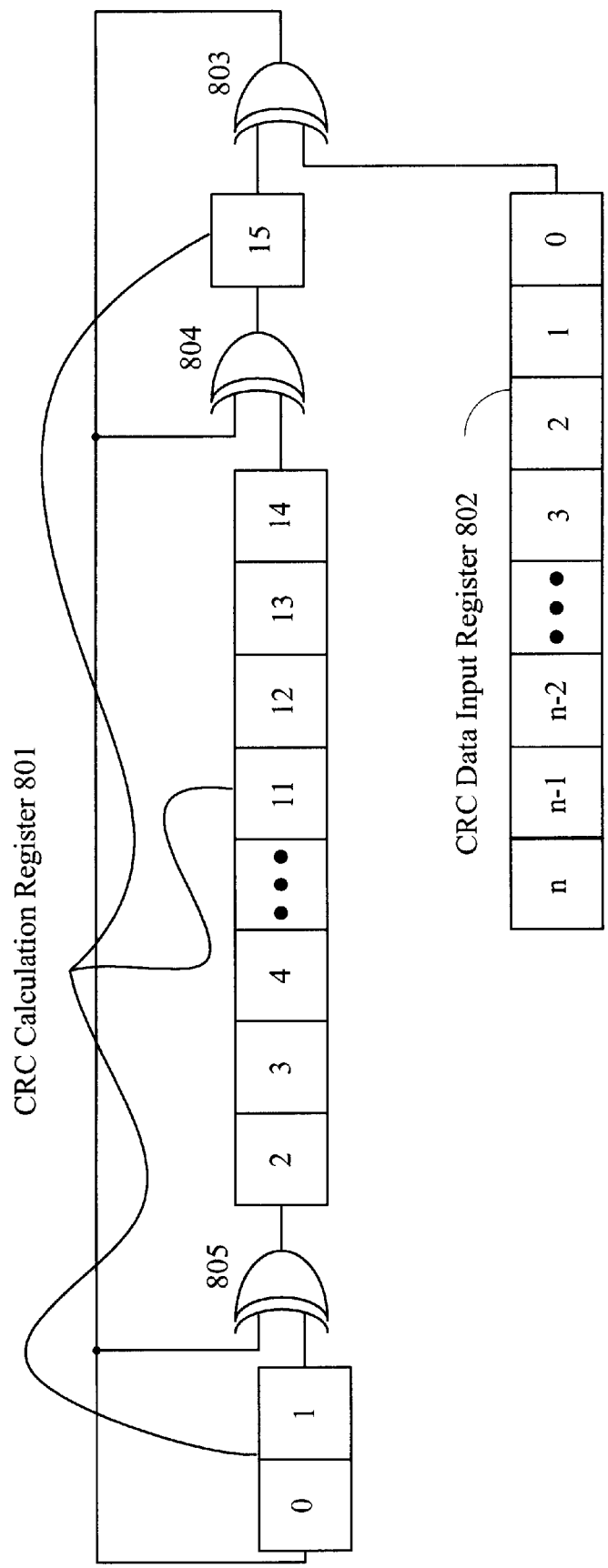
FIG. 8 shows an illustrative 16-bit shift CRC calculation register that can implement the checksum algorithm used in one embodiment of the present invention.

During readback, the values generated by the test design at predetermined nodes in the FPGA, such as the states of the flip-flops, can be compared to the same values generated at the same nodes in a fault-free model of the same design. In one embodiment, a fault-free signature is derived from simulation. The signature produced during readback is compared to the fault-free signature. Any difference between these signatures indicates that one or more faults have been detected. Various known signatures can be used including, but not limited to, cyclic redundancy checking (CRC). Using CRC, one checksum calculation can be performed on the actual data and another checksum calculation can be performed on the fault-free data. FIG. 8 shows an illustrative 16-bit shift CRC calculation register 801 and a CRC data input register 802 that can implement the checksum algorithm provided in Equation 1.

$$CRC(16 \text{ bits}) = X^{16} + X^{15} + X^2 + 1 \qquad \text{(Equation 1)}$$

wherein $X^{16}$ represents the value output by XOR gate 803, $X^{15}$ represents the value output by XOR gate 804, and $X^2$ represents the value output by XOR gate 805. In this embodiment, bit 0 of CRC calculation register 801 receives an XOR of the incoming data and the output of bit 15; bit 2 receives an XOR of the input to bit 0 and the output of bit 1; and bit 15 receives an XOR of the input to bit 0 and the output of bit 14. Note that other embodiments of the present invention can use a larger or smaller CRC register depending on the requirements of accuracy and the limitations of cost. The process of calculating the first and second checksums is well known in the art and therefore is not explained in detail herein.

Note that other types of compression/capture/analysis can be used to provide signatures. In another embodiment, every bit in the readback data can be verified, thereby eliminating the need for signatures.

Other Design Modifications

In accordance with one aspect of the invention, certain resources of the FPGA used in the user's design are modified to ensure both control and observability during fault simulation.

Figure 9A:
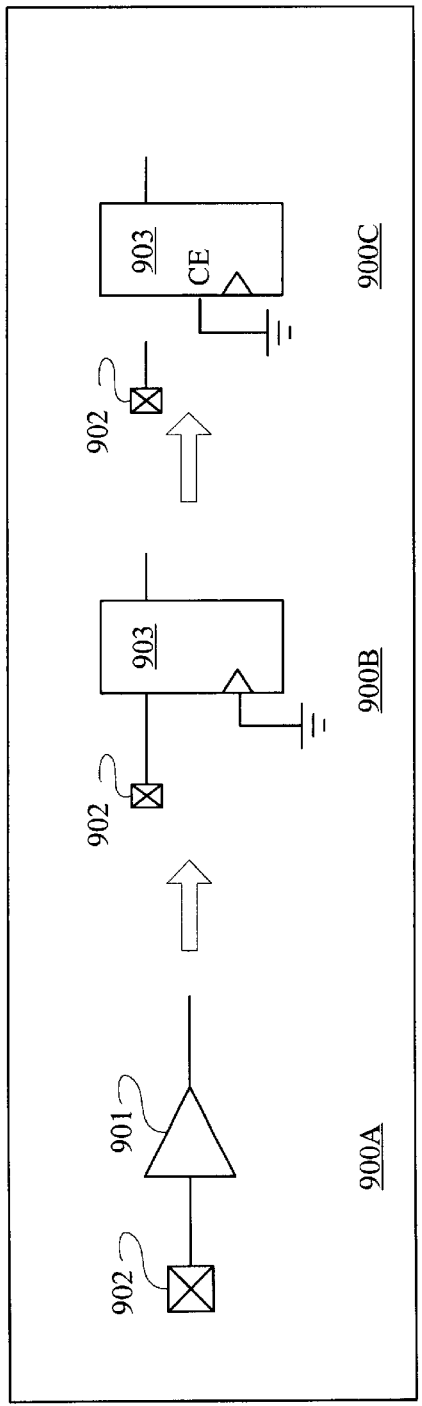
FIG. 9A illustrates modifications that can be made to an input element in the IOB to ensure controlability during a fault test in accordance with the present invention.

FIG. 9A illustrates modifications that can be made to certain input resources in the IOBs to ensure controlability during fault simulation. For example, assume a user's IOB design 900A includes a buffer 901 for receiving an input signal from a pin 902. In the present invention, buffer 901 is transformed into a registered input in a modified design 900B. In one embodiment, the registered input is a flip-flop 903 configured as a transparent latch. Of importance, transforming buffer 901 into flip-flop 903 (configured as a transparent latch) maintains the user's design path while providing controlability of the output signal provided by the IOB.

Specifically, in the Virtex FPGA, the flip-flops in the IOBs include an INIT terminal, but not a REV terminal. Therefore, to perform the stuck-at-zero or stuck-at-one tests, these flip-flops are transformed to supply a constant logic "1" for the stuck-at-zero test, or a constant logic "0" for the stuck-at-one test. As shown in modified test design 900C, during either test, flip-flop 903 is disconnected from pin 902 and its clock enable terminal CE is grounded, thereby rendering the clock terminal inactive. At this point, INIT can be set to logic "0" for the stuck-at-one test or to logic "1" for the stuck-at-zero test.

In another embodiment, if the flip-flops include the features of the standard CLB flip-flops (described above in detail), then the INIT and REV terminals of a flip-flop can be advantageously used to provide the appropriate signal during the stuck-at-one test or the stuck-at-zero test.

Figure 9B:
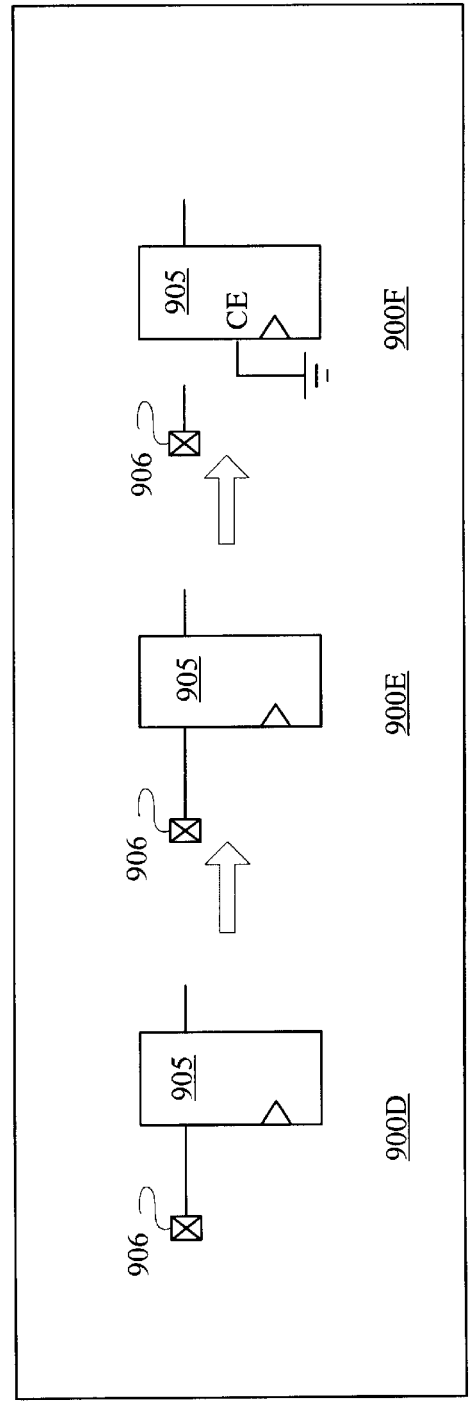
FIG. 9B illustrates modifications that can be made to another input element in the IOB to ensure controlability during a fault test in accordance with the present invention.

FIG. 9B illustrates one input resource in the IOB that can remain unmodified. Specifically, if a user's IOB design 900D already includes a flip-flop 905 for receiving an input signal from a pin 906, then flip-flop 905 can remain unmodified in modified design 900E. In a modified test design 900F, during either the stuck-at-one test or the stuck-at-zero test, flip-flop 905 is disconnected from pin 906 and its clock enable terminal CE is grounded, thereby rendering the clock terminal inactive. At this point, INIT can be set to logic "0" for the stuck-at-one test or to logic "1" for the stuck-at-zero test.

Note that because the modified test designs disconnect the flip-flops in the IOBs from their respective pins no burden is placed on the user system to maintain logic levels for the stuck-at-one or the stuck-at-zero tests. However, this disconnection also renders these tests inapplicable for stuck-at faults between the pins and the input flip-flops.

Figure 10A:
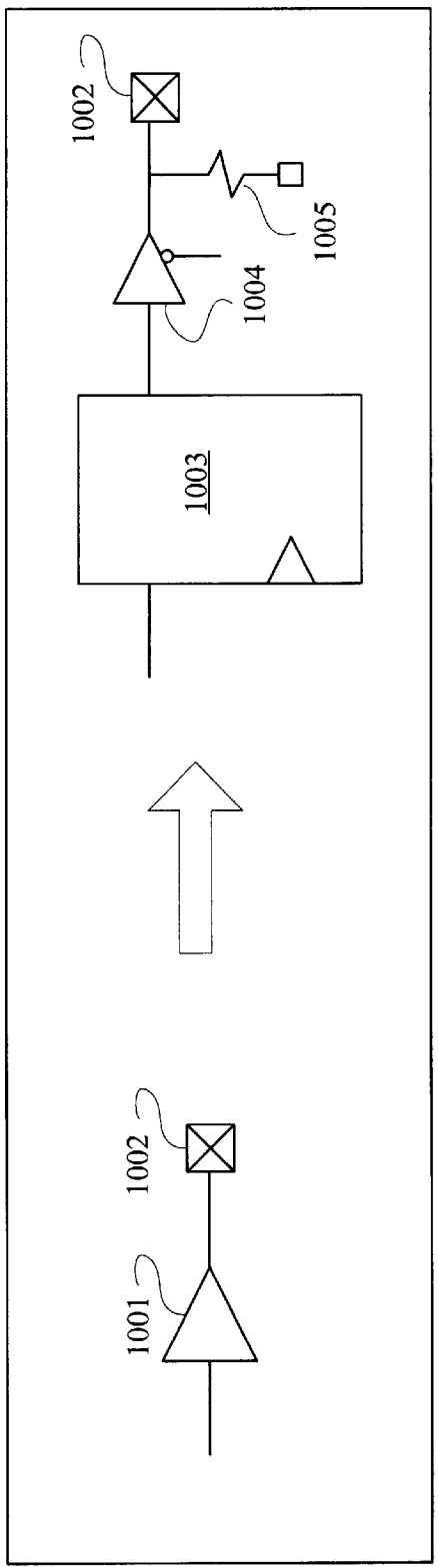
FIGS. 10A and 10B illustrate modifications that can be made to output elements in the IOB during a fault test in accordance with the present invention.
Figure 10B:
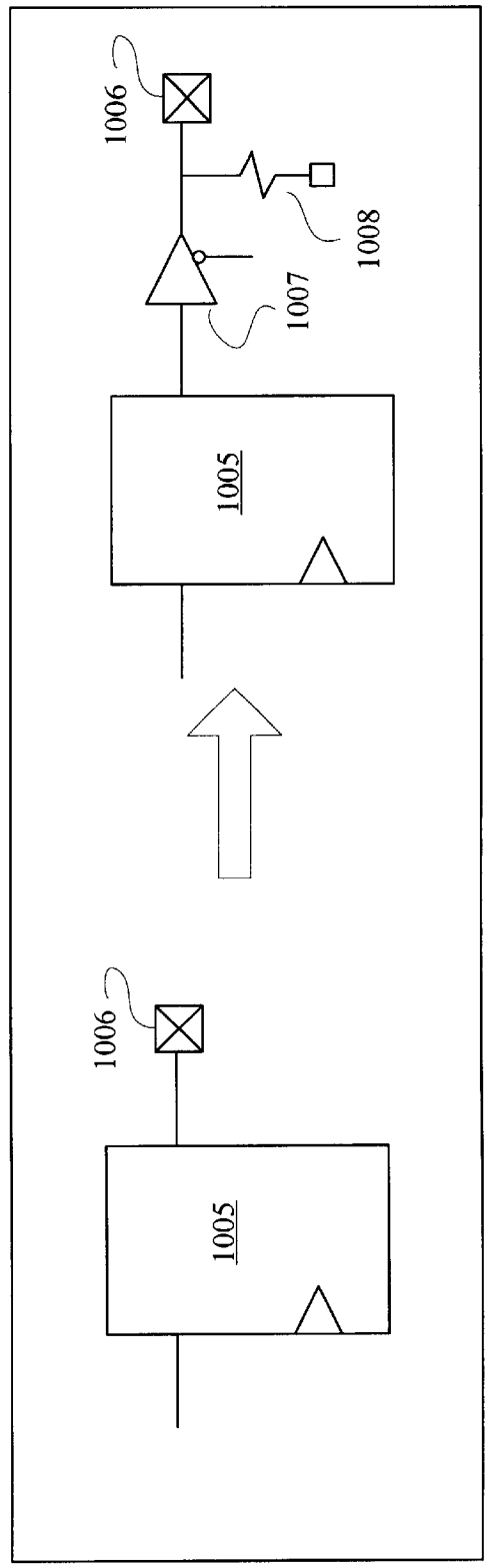

In a similar manner, FIGS. 10A and 10B illustrate modifications that can be made to output resources in the IOB. Specifically, FIG. 10A illustrates an output buffer 1001 for providing a signal to an output pin 1002. In accordance with the present invention, output buffer 1001 is transformed into a registered output with a non-inverting data path. In one embodiment, this registered output is a flip-flop 1003. Note that because the output flip-flops in the Virtex architecture lack REV terminals, they need to be inited to the opposite state from the slice flip-flops in the test design (i.e. inited to "1" during the stuck-at-one test and inited to "0" during the stuck-at-zero test). The subsequent readback can verify that the test has written over the output flip-flops' init state. Because pin 1002 can be connected to external devices, a tri-state buffer 1004 and a pull-up (or pull-down) element 1005 can be added in the transformation to ensure predictable and safe voltage levels in the end use system.

FIG. 10B illustrates one output resource that can remain unmodified. Specifically, if a user's IOB design already includes a flip-flop 1005 for providing an output signal to a pin 1006, then sip-flop 1005 can remain unmodified. However, as noted with respect to FIG. 10A, because pin 1006 can be connected to external devices, a tri-state buffer 1007 and a pull-up (or pull-down) element 1008 can be added to ensure predictable and safe voltage levels on the board. Note that the modified user designs shown in FIGS. 10A and 10B, which can be used in the modified test designs for the stuck-at-one and the stuck-at-zero tests, render these tests inapplicable for stuck-at faults between the output flip-flops and the pins.

To provide process 600 of the present invention, control logic can be used to interface to the user's logic. Specifically, as described above, the INIT, REV, and CLK signals must be provided at predetermined times to conform to process 600. In one embodiment of the present invention, the control logic for providing the appropriate signals is implemented along with the user's design on the FPGA. In other words, the control logic is implemented using configurable resources on the FPGA, just as the user's design is implemented. In another embodiment, the control logic can be placed on another chip that provides control signals to the user's design on the FPGA. Note that in any embodiment, this control logic is not modified or transformed during the stuck-at-one or stuck-at-zero tests.

Further note that not all IOBs are modified in the present invention. For example, the present invention would not modify the IOBs receiving the user's clock signal CLK or the signal RUN activating the test mode. The present invention would also not modify the IOBs providing the signal DONE indicating the test mode is finished, the clock signals STROBE indicating the CRC bits, or the signals DATA providing the CRC values. In other embodiments of the present invention, JTAG could be used to reduce the number of input/output pins necessary to the present invention.

Test Mode Activation and Clock Control

Figure 11:
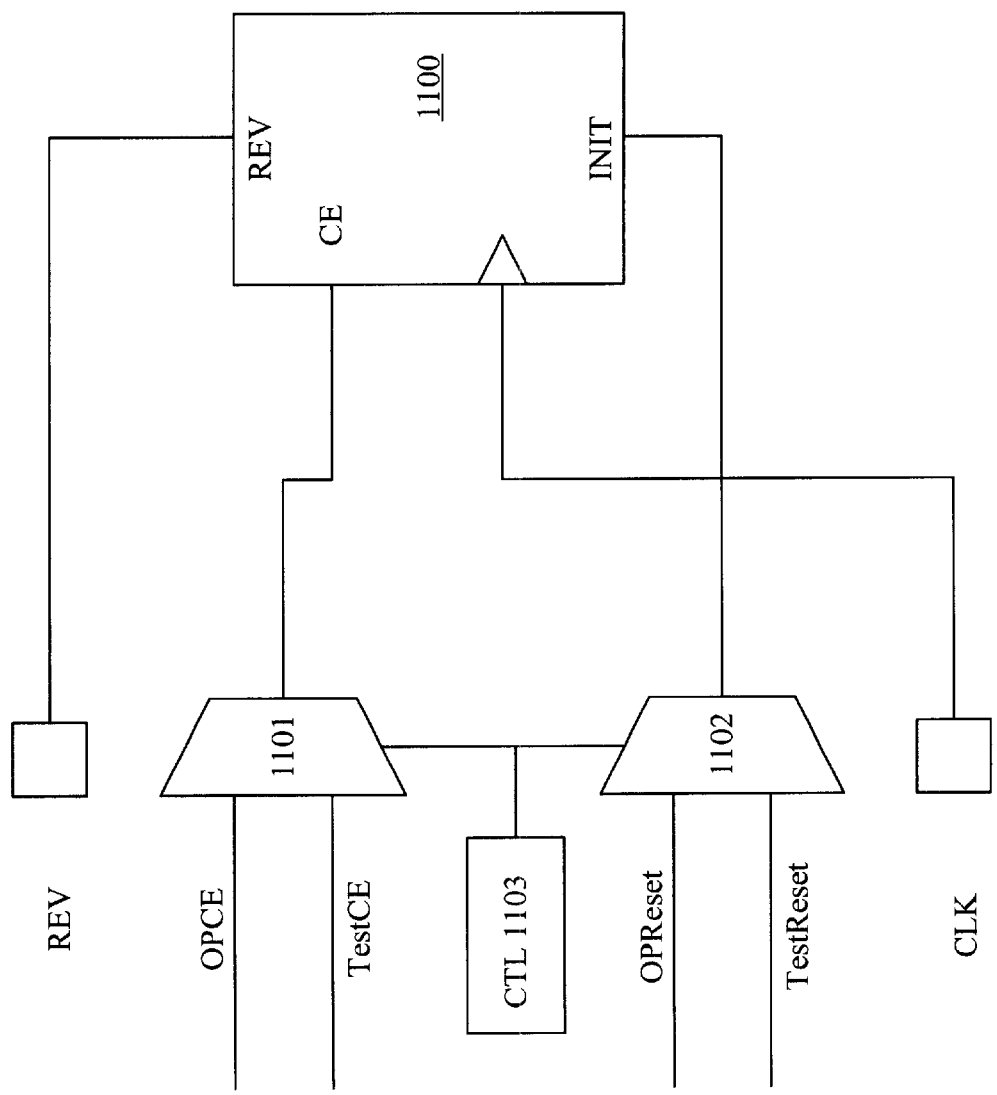
FIG. 11 illustrates a mechanism by which INIT, CE, and CLOCK can be switched between normal use in the end use design and the test mode.

FIG. 11 illustrates a mechanism by which INIT and CE can be switched between normal use in the end use design and the test mode. In FIG. 11, a clock enable multiplexer 1101 receives two signals. A first clock enable (CE) signal, OPCE, indicates that the standard operating mode should be followed. A second CE signal, TestCE, indicates that the test mode of the present invention should be followed. In a similar manner, an INIT multiplexer 1102 receives two signals. A first INIT signal, OPReset, indicates that the standard operating mode should be followed. A second INIT signal, TestReset, indicates that the test mode of the present invention should be followed. Control logic 1103 provides a control signal that determines which signal pair (i.e. OPCE/ OPReset or TestCE/TestReset) is output by multiplexers 1101 and 1102. The output signal of multiplexer 1101 is provided to the clock enable terminal of a flip-flop 1100 (wherein flip-flop 1100 represents an exemplary synchronous element of the user's design on the FPGA), whereas the output signal of multiplexer 1102 is provided to the INIT terminal of flip-flop 1100. The standard logic generating the clock signal CLK and reverse signal REV, as well as control logic 1103 are not modified during the above-described tests. In another embodiment, instead of controlling CE at each flip-flops as shown in FIG. 11, a control clock (not shown) can be used to control all slice flip-flops.

Memory in the Design

In addition to controlling the synchronous elements during the stuck-at-one and stuck-at-zero tests, the present invention can also control and observe the values stored by any memory in the user's design. In the Virtex FPGA and other types of PLDS, block random access memory (BRAM) can be provided. The BRAM typically includes one or more columns of storage elements extending over multiple rows of CLBs. In operation, each BRAM behaves as a register having an input terminal and an output terminal. Note that the width (typically in bits) and the depth of the BRAM can differ significantly from one FPGA to another. Advantageously, the present invention is equally applicable to any such BRAM.

In the stuck-at-one test, the BRAM is initialized during configuration to all ones. The first test clock causes the initialization values on the input terminals of the BRAM to appear on the output terminals. Thus, all ones should appear on the BRAM output terminals. Also during the first test clock, a zero is written to address 0. The second test clock causes the zero on the input terminal at address 0 to appear on the BRAM output terminal, while a zero is re-written into address 0. Capture/readback can verify that a zero was propagated from that BRAM output terminal to a downstream flip-flop. Readback of the BRAM verifies that a zero was written into address zero and into no other cell. Control pins, such as write enable (WE) and enable (ENA), are programmed to be active low for the stuck-at-one test.

In the stuck-at-zero test, the BRAM is initialized during configuration to all zeros. The first test clock causes the initialization values on the input terminals of the BRAM to appear on the output terminals. Thus, all zeros should appear on the BRAN output terminals. Also during the first test clock, a one is written to the address designated by all ones (referenced herein as address XXX). The second test clock causes the one on the input terminal at address XXX to appear on the BRAM output terminal, while a one is re-written into address XXX. Capture/readback can verify that a one was propagated from that BRAM output terminal to a downstream flip-flop. Readback of the BRAM verifies that a one was written into address XXX and into no other cell. Control pins, such as write enable (WE) and enable (ENA), are programmed to be active high for the stuck-at-zero test.

Figure 12:
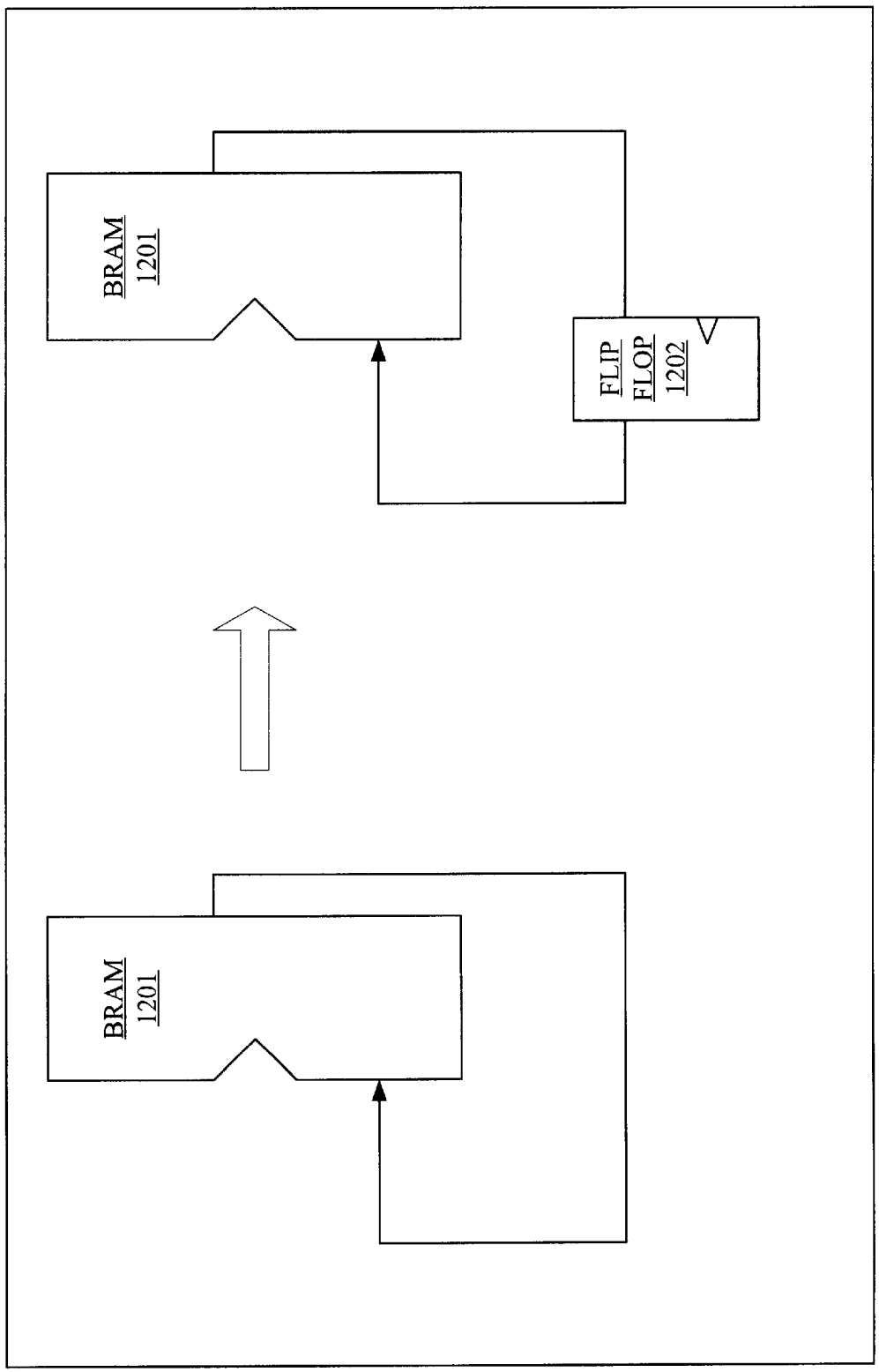
FIG. 12 illustrates a modification that can be made to a block RAM in accordance with the present invention.

FIG. 12 illustrates a simplified representation of a BRAM 1201 in a user's design. In this design, an output is provided as an input to the same BRAM, i.e. a feedback loop. In accordance with the present invention, BRAM 1201 is transformed to include a synchronous element (in this example, a flip-flop) 1202 configured as a transparent latch. In this manner, the present invention advantageously maintains the essential path of the user's design while controlling the input to BRAM 1201. Note that any BRAM providing an output to any other BRAN is also modified in the same manner according to the present invention.

Fault Coverage Quality

Fault coverage measures the quality of the vectors to detect all possible stuck-at-one and stuck-at-zero faults. In the present invention, the programmable interconnect of an FPGA is exercised to detect all possible faults. As explained above, in a user's design limited to LUTs, flip-flops, and memory, the present invention can quickly and reliably provide fault coverage approaching 100% for stuck-at-zero and stuck-at-one faults in the programmable interconnect. Moreover, in the method. described above, the number of vectors to provide complete fault coverage is reduced to 2 irrespective of the number of primary inputs. Thus, the present invention renders the complexity of the logic function provided by the user's design irrelevant, thereby significantly simplifying the fault coverage process. Note that in user designs including other elements, such as tri-state buffers, microprocessors, etc., fault coverage is probably less than 100%. However, the present invention can detect some faults even in such designs.

Other Embodiments

The descriptions of the present invention provided herein are illustrative only and not limiting. For example, in another embodiment of the invention, other logic gates, such as NAND and NOR gates, replace the AND and OR gates in the logic gate tree designs. Furthermore, although LUTs are described in detail herein, the present invention is applicable to other types of function generators including, but not limited to, multiplexers.

Finally, although FPGAs and their configuration are discussed in detail, the present invention is equally applicable to other programmable logic devices that include function generators, sequential elements, and/or memory. Other embodiments will be apparent to those skilled in the art. Therefore, the scope of the present invention is limited only by the appended claims.

What is claimed is:

1. A method of providing fault coverage for programmable interconnect in a programmable logic device, the method comprising:

identifying programmable interconnect and function generators used in a user's design;

generating a first derivative design by using the programmable interconnect in the user's design and replacing functions implemented in the function generators in the user's design with a first logic function;

providing a first vector to the first derivative design; and observing predetermined nodes in the first derivative design to identify a first type of fault in the programmable interconnect used in the user's design.

2. The method of claim 1, wherein the user's design includes synchronous elements, and wherein the first derivative design includes synchronous elements providing output signals of predetermined values.

3. The method of claim 1, wherein the first logic function is an AND function and wherein the first type of fault is a stuck-at-zero fault.

4. The method of claim 1, wherein the first logic function is an OR function and wherein the first type of fault is a stuck-at-one fault.

5. The method of claim 1, further comprising:

generating a second derivative design by replacing function generators in the original design with a second logic function;

providing a second vector to the second derivative design; and observing predetermined nodes in the second derivative design to identify a second type of fault in the programmable interconnect used in the user's design.

6. The method of claim 1, wherein the user's design includes memory comprising a plurality of memory inputs and a plurality of memory outputs, the method further including performing a first memory test comprising:

writing a first logic state to a first address of the memory;

writing a second logic state to all addresses of the memory other than the first address, the second logic state being opposite that of the first logic state; and verifying that the first logic state was written only to the first address of the memory.

7. The method of claim 6, wherein the first logic state comprises a logic zero and wherein the first memory test comprises a stuck-at-one test.

8. The method of claim 6, wherein the first logic state comprises a logic one and wherein the first memory test comprises a stuck-at-zero test.

9. The method of claim 6, further comprising performing a second memory test, the second memory test comprising:

writing the second logic state to a second address of the memory;

writing the first logic state to all addresses of the memory other than the second address; and verifying that the second logic state was written only to the second address of the memory.

10. The method of claim 1, further comprising transforming non-registered input structures in the user's design into registered input structures by incorporating flip flops into the non-registered input structures.

11. The method of claim 1, further including transforming non-registered output structures in the user's design into registered output structures by incorporating flip flops into the non-registered output structures.

12. The method of claim 11, wherein transforming non-registered output structures further comprises coupling a tri-state buffer to a flip flop.

13. A method of providing fault coverage for programmable interconnect in a programmable logic device, the method comprising:

identifying programmable interconnect in a user's design;

generating a first derivative design by replacing functions implemented in function generators in the user's design with a first logic function;

initializing synchronous elements in the first derivative design to a first state;

applying a clock to the synchronous elements in the first derivative design;

analyzing predetermined nodes in the first derivative design to identify faults of a first fault type.

14. The method of claim 13, wherein the synchronous elements in the first derivative design comprise initialization-terminals and reverse terminals for forcing the synchronous elements in the first derivative design into the first state and a second state opposite that of the first state, and further comprising:

asserting an initialization signal at the initialization terminals of the synchronous elements in the first derivative design;

asserting a reverse signal at the reverse terminals of the synchronous elements in the first derivative design; and analyzing a second set of predetermined nodes in the first derivative design to identify faults of a fault type associated with the synchronous elements in the first derivative design.

15. The method of claim 14, wherein generating the first derivative design further comprises transforming synchronous elements in the user's design into synchronous elements having initialization terminals and reverse terminals.

16. The method of claim 14, wherein the first logic function comprises an AND function, and wherein the first state comprises a logic 1; and wherein the first fault type comprises a stuck-at-zero fault.

17. The method of claim 15, wherein the first logic function comprises an OR function, wherein the first state comprises a logic 0; and wherein the first fault type comprises a stuck-at-one fault.

18. The method of claim 13, further comprising:

generating a second derivative design by replacing functions implemented in function generators in the user's design with a second logic function;

initializing synchronous elements in the second derivative design to a second state opposite that of the first state;

applying a clock to the synchronous elements in the second derivative design; and analyzing predetermined nodes in the second derivative design to identify faults of a second fault type.

19. The method of claim 13, wherein analyzing comprises comparing values at the predetermined nodes in the first derivative design to values generated at identical nodes in a fault-free model of the first derivative design.

20. The method of claim 13, wherein analyzing comprises:

performing a plurality of readback operations to generate accumulated readback data; and checking for faults of the first fault type by performing a single comparison step for the accumulated readback data.

\* \* \* \* \*